(12) United States Patent
Tang et al.

(10) Patent No.: US 11,049,928 B2
(45) Date of Patent: Jun. 29, 2021

(54) ORGANIC LIGHT EMITTING DIODE DISPLAY HAVING AN EXTENSION SUBSTRATE

(71) Applicant: WUHAN CHINA STAR OPTOELECTRONICS TECHNOLOGY CO., LTD., Hubei (CN)

(72) Inventors: Yuejun Tang, Hubei (CN); Xueyun Li, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 25 days.

(21) Appl. No.: 16/619,087

(22) PCT Filed: Dec. 15, 2018

(86) PCT No.: PCT/CN2018/121362
§ 371 (c)(1),
(2) Date: Dec. 4, 2019

(87) PCT Pub. No.: WO2020/103241
PCT Pub. Date: May 28, 2020

(65) Prior Publication Data
US 2020/0321426 A1 Oct. 8, 2020

(30) Foreign Application Priority Data
Nov. 22, 2018 (CN) .......................... 201811395657.7

(51) Int. Cl.
*H01L 27/32* (2006.01)
*H01L 51/00* (2006.01)
*H01L 51/52* (2006.01)

(52) U.S. Cl.
CPC ...... *H01L 27/3279* (2013.01); *H01L 51/0097* (2013.01); *H01L 51/5237* (2013.01); *H01L 2251/5338* (2013.01)

(58) Field of Classification Search
CPC ............. H01L 27/3279; H01L 51/0097; H01L 51/5237
See application file for complete search history.

(56) References Cited

U.S. PATENT DOCUMENTS 7,880,829 B2 * 2/2011 Park .................... G02F 1/13452
349/58
8,372,762 B2 * 2/2013 Oishi ................. B23K 26/0676
438/785

(Continued)

FOREIGN PATENT DOCUMENTS

CN 106023811 A 10/2016

*Primary Examiner* — Ida M Soward
(74) *Attorney, Agent, or Firm* — Mark M. Friedman (57) ABSTRACT

The present invention provides an organic light emitting diode (OLED) display, which includes a substrate, a light emitting layer and an encapsulation layer. Wherein at least one connecting terminal and a first connection end are disposed on a rear surface of the substrate, and the connecting terminal is provided with a signal line electrically connected to the first connection end. An edge of the substrate is provided with an extension substrate, the extension substrate is provided with a second connection end, and the first connection end and the second connection end are electrically connected through a flexible circuit board.

8 Claims, 9 Drawing Sheets

(56) References Cited

U.S. PATENT DOCUMENTS

| | | | | |
|---|---|---|---|---|
| 8,710,736 | B2* | 4/2014 | Ryu | H01L 27/3276 |
| | | | | 313/505 |
| 8,735,936 | B2* | 5/2014 | Kim | H01L 51/5256 |
| | | | | 257/100 |
| 9,690,329 | B2* | 6/2017 | Jung | G06F 1/1637 |
| 9,780,157 | B2* | 10/2017 | Kwon | H01L 27/124 |
| 9,818,974 | B2* | 11/2017 | Kwon | G02F 1/133305 |
| 10,175,514 | B2* | 1/2019 | Tang | G02F 1/133305 |
| 10,366,272 | B2* | 7/2019 | Song | G06K 9/0004 |
| 10,446,769 | B2* | 10/2019 | Kim | G02F 1/133305 |
| 10,672,858 | B2* | 6/2020 | Lee | G02F 1/133305 |
| 10,692,891 | B2* | 6/2020 | Miyaguchi | H05K 1/028 |
| 10,734,462 | B2* | 8/2020 | Nishinohara | H01L 27/3276 |
| 10,916,735 | B2* | 2/2021 | Kwon | H01L 27/3246 |
| 2002/0015005 | A1* | 2/2002 | Imaeda | G02F 1/13452 |
| | | | | 345/5 |
| 2009/0167171 | A1* | 7/2009 | Jung | H01L 51/5237 |
| | | | | 313/504 |
| 2012/0256896 | A1* | 10/2012 | Yamazaki | G02F 1/133385 |
| | | | | 345/211 |
| 2014/0268595 | A1* | 9/2014 | Eom | H05K 1/028 |
| | | | | 361/749 |
| 2014/0369009 | A1 | 12/2014 | Cho | |
| 2016/0062506 | A1* | 3/2016 | Namkung | G06F 1/1626 |
| | | | | 345/174 |
| 2018/0081232 | A1* | 3/2018 | Park | G02F 1/13306 |
| 2018/0159067 | A1* | 6/2018 | Min | H05K 999/99 |
| 2018/0321530 | A1* | 11/2018 | Tada | G02F 1/133512 |
| 2019/0221762 | A1 | 7/2019 | Saeki et al. | |

\* cited by examiner

ORGANIC LIGHT EMITTING DIODE DISPLAY HAVING AN EXTENSION SUBSTRATE

FIELD OF INVENTION

The present invention relates to the field of display technologies, and in particular, to an organic light emitting diode (OLED) display.

BACKGROUND OF INVENTION

At present, organic light emitting diode (OLED) displays have attracted attention as display devices for displaying images. Unlike liquid crystal display (LCD) devices, OLED displays have self-illuminating properties and do not use a separate light source, so they can be fabricated thinner and lighter than display devices with separate light sources, and easy to achieve flexible, foldable display characteristics.

However, in large OLED displays, when display signals are transmitted from connecting terminals to each part of displays, due to large display areas, an attenuation, delay, and unevenness may occur when the signals are transmitted, resulting in deterioration of the display quality.

TECHNICAL PROBLEM

When display signals are transmitted from connecting terminals to each part of displays, due to large display areas, an attenuation, delay, and unevenness may occur when the signals are transmitted, resulting in deterioration of a display quality.

TECHNICAL SOLUTION

An organic light emitting diode (OLED) display, comprises:
a substrate;
a light emitting layer disposed on the substrate;
an encapsulation layer disposed on the light emitting layer; and
a border disposed on a periphery of the encapsulation layer;
wherein at least one connecting terminal and a first connection end are disposed on a rear surface of the substrate, and the connecting terminal is provided with a signal line electrically connected to the first connection end; an edge of the substrate is provided with an extension substrate, the extension substrate is provided with a second connection end, and the first connection end and the second connection end are electrically connected through a flexible circuit board; a driving circuit and a connection line are disposed on the rear surface of the substrate or the extension substrate.

In an embodiment provided by the present invention, the first connection end is disposed on the rear surface of the substrate at a position close to the second connection end.

In an embodiment provided by the present invention, the extension substrate is made of a flexible material, the extension substrate is bent toward the rear surface of the substrate to form a bent portion, and the second connection end is disposed on one side of the substrate opposite to the first connecting end before the extension substrate is bent.

In an embodiment provided by the present invention, a gap is disposed between the bent portion and the substrate, and the gap is filled with adhesive glue.

In an embodiment provided by the present invention, the extension substrate is parallel to the substrate, the second connection end is disposed on a front surface of the extension substrate, and at least a portion of the first connection end is disposed at an edge position of the substrate.

In an embodiment provided by the present invention, the connecting terminal is disposed at a position on the rear surface of the substrate near the first connection end, or the connecting terminal is disposed at a middle portion of the substrate.

In an embodiment provided by the present invention, a protective layer covering the signal line is disposed on the rear surface of the substrate.

In an embodiment provided by the present invention, the substrate comprises a first substrate and a second substrate disposed on the first substrate, the extension substrate is integrally formed with the second substrate, and the second substrate is made of a flexible material.

An organic light emitting diode (OLED) display, comprises:
a substrate;
a light emitting layer disposed on the substrate;
an encapsulation layer disposed on the light emitting layer; and
a border disposed on a periphery of the encapsulation layer;
wherein at least one connecting terminal and a first connection end are disposed on a rear surface of the substrate, and the connecting terminal is provided with a signal line electrically connected to the first connection end; an edge of the substrate is provided with an extension substrate, the extension substrate is provided with a second connection end, and the first connection end and the second connection end are electrically connected to each other through a flexible circuit board.

In an embodiment provided by the present invention, the first connection end is disposed on the rear surface of the substrate at a position close to the second connection end.

In an embodiment provided by the present invention, the extension substrate is made of a flexible material, the extension substrate is bent toward the rear surface of the substrate to form a bent portion, and the second connection end is disposed on one side of the substrate opposite to the first connecting end before the extension substrate is bent.

In an embodiment provided by the present invention, a gap is disposed between the bent portion and the substrate, and the gap is filled with adhesive glue.

In an embodiment provided by the present invention, the extension substrate is parallel to the substrate, the second connection end is disposed on a front surface of the extension substrate, and at least a portion of the first connection end is disposed at an edge position of the substrate.

In an embodiment provided by the present invention, a driving circuit and a connection line are disposed on the extension substrate.

In an embodiment provided by the present invention, a driving circuit and a connection line are disposed on the rear surface of the substrate.

In an embodiment provided by the present invention, the connecting terminal is disposed at a position on the rear surface of the substrate near the first connection end, or the connecting terminal is disposed at a middle portion of the substrate.

In an embodiment provided by the present invention, a protective layer covering the signal line is disposed on the rear surface of the substrate.

In an embodiment provided by the present invention, the substrate comprises a first substrate and a second substrate disposed on the first substrate, the extension substrate is integrally formed with the second substrate, and the second substrate is made of a flexible material.

BENEFICIAL EFFECT

By disposing connecting terminals on a rear surface of a substrate, the rear surface of the substrate has a sufficient surface space to arrange low resistance lines. At the same time, a transmission of display signals by a first connection end and a second connection end reducing an attenuation, delay, and unevenness of transmission signals, thereby improving a display quality.

DESCRIPTION OF DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

REFERENCE NUMERALS

10: substrate; 10a rear surface of substrate; 11: first substrate; 12: second substrate; 13: extension substrate; 20: light emitting layer; 30: encapsulation layer; 40: first connection end; 50: second connection end; 60: connecting terminal; 70: flexible circuit board; 80: signal line; 90: adhesive glue; 101: protective layer; 102: border.

DETAILED DESCRIPTION OF PREFERRED EMBODIMENTS

The following embodiments refer to the accompanying figures for exemplifying specific implementable embodiments of the present invention in a suitable computing environment. It should be noted that the exemplary described embodiments are configured to describe and understand the present invention, but the present invention is not limited thereto. Directional terms, such as an upper side, a lower side, a front side, a back side, a left side, a right side, an inner side, an outer side, and a lateral side, mentioned in the present invention are only for reference. Therefore, the directional terms are used for describing and understanding rather than limiting the present invention. In the figures, units having similar structures are used for the same reference numbers.

The invention is directed to current organic light emitting diode (OLED) displays. When display signals are transmitted from connecting terminal to each part of displays, due to large display areas, there are undesirable phenomena such as an attenuation, delay, and unevenness occur when transmitting signals, which leads to technical problems of deterioration of display quality. The invention can solve the above problems.

First Embodiment

An OLED display, the OLED display is a top-emitting OLED display.

Figure 1:
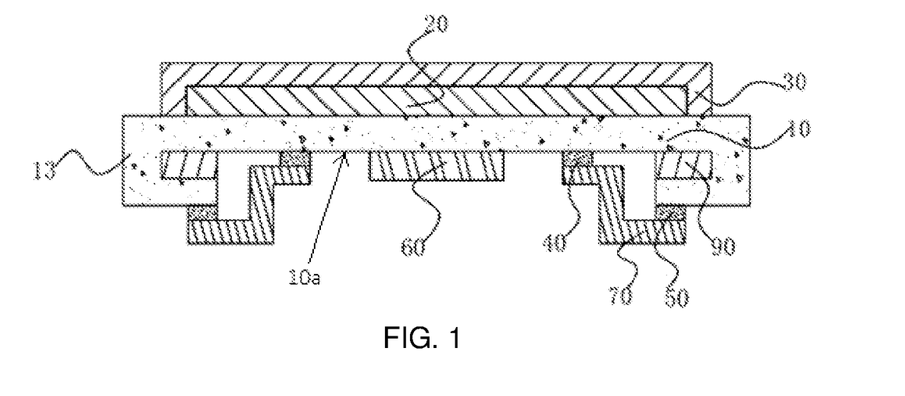
FIG. 1 is a schematic structural view of an organic light emitting diode (OLED) display after an extension substrate is bent according to a first embodiment of the present invention.
Figure 2:
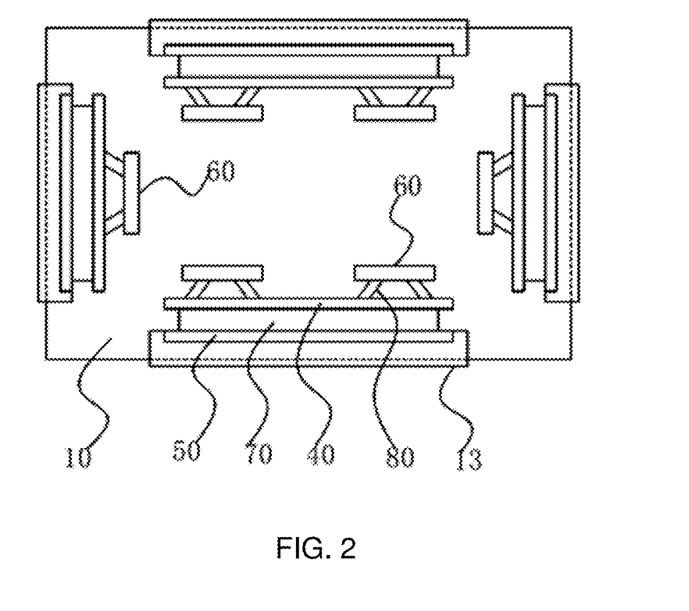
FIG. 2 is a schematic view showing a rear surface of a substrate after the extension substrate is bent according to the first embodiment of the present invention.

As shown in FIG. 1 and FIG. 2, the OLED display comprises a substrate 10, a light emitting layer 20 disposed on the substrate 10, and an encapsulation layer 30 disposed on the light emitting layer 20.

Wherein, the substrate 10 is provided with metal lines and circuits required for display signals of the OLED display. The light emitting layer 20 comprises a plurality of light emitting devices, and the light emitting layer 20 emits light through the encapsulating layer 30 to reach human eyes. A side of the substrate 10 adjacent to the encapsulation layer 30 is a front surface of the substrate 10. The encapsulation layer 30 may be a cover package or a thin film package.

Further, at least one connecting terminal 60 and a first connection end 40 are disposed on a rear surface 10a of the substrate 10, and the connecting terminal 60 is provided with a signal line 80 electrically connected to the first connection end 40. An edge of the substrate 10 is provided with an extension substrate 13, the extension substrate 13 is provided with a second connection end 50, and the first connection end 40 and the second connection end 50 are electrically connected through a flexible circuit board 70.

By disposing the connecting terminal 60 on a rear surface 10a of the substrate 10, the rear surface 10a of the substrate 10 has a sufficient surface space to arrange low resistance lines, which can reduce an attenuation, delay, and unevenness of transmission signals, thereby improving a display quality Specifically, the first connection end 40 is disposed on the rear surface 10a of the substrate 10 at a position close to the second connection end 50.

By providing the extension substrate 13 at the edge position of the substrate 10, the display signal is transmitted by the flexible circuit board 70 in the vicinity, and the attenuation, delay, and unevenness of the transmission signal are reduced.

Specifically, the extension substrate 13 is integrally formed with the substrate 10, and the substrate 10 is made of a flexible material. The extension substrate 13 is bent toward the rear surface 10a of the substrate 10 to form a bent portion. A gap is disposed between the bent portion and the substrate, and the gap is filled with adhesive glue 90.

The connection strength between the bent portion and the substrate 10 is improved by the adhesive glue 90, and the displacement of the bent portion is prevented to cause the connection between the first connection end 40 and the second connection end 50 to be disconnected.

Figure 3:
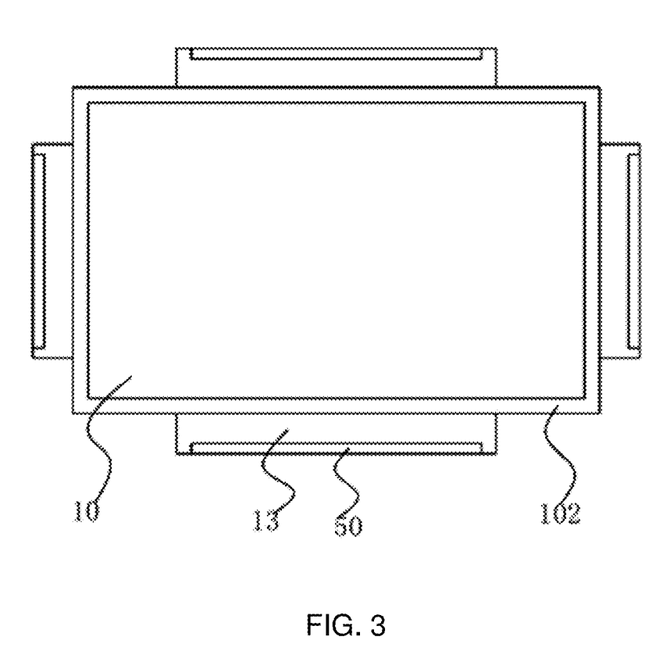
FIG. 3 is a schematic view showing a front surface of the substrate when the extension substrate is not bent according to the first embodiment of the present invention.
Figure 4:
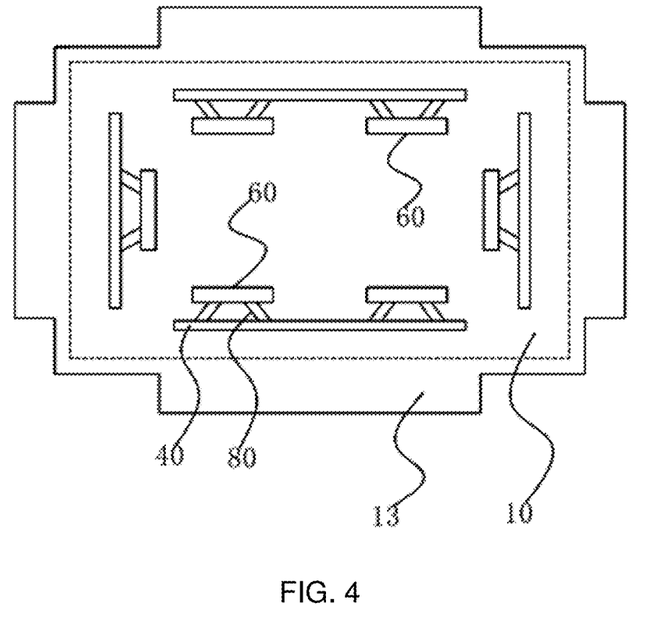
FIG. 4 to FIG. 5 are schematic views showing the rear surface of the substrate when the extension substrate is not bent according to the first embodiment of the present invention.

As shown in FIG. 3 and FIG. 4. FIG. 3 is a schematic view of a front surface of the substrate 10 when the extension substrate 13 is not bent, and FIG. 4 is a schematic view of the rear surface 10a of the substrate 10 when the extension substrate 13 is not bent. The OLED display further comprises a border 102 disposed on a periphery of the encapsulation layer 30.

When the substrate 10 is cut to form the substrate 10 with a standard specification, the extension substrate 13 is reserved. After the encapsulation process is completed to form the encapsulation layer 30, the extension substrate 13 is bent toward the rear surface 10a of the substrate 10, and the first connection end 40 and the second connection end 50 are electrically connected through the flexible circuit board 70. The first connection end 40 is provided with a signal line 80 connected to the connecting terminal 60, and the connecting terminal 60 is electrically connected to the driving chip.

It should be noted that the connection of the flexible circuit board 70 to the first connection end 40 and the second connection end 50 comprises, but is not limited to, bonding using an anisotropic conductive film (ACF) glue.

The second connection end 50 is disposed on a front surface of the extension substrate 13, and the first connection end 40 is disposed at a preset position on the rear surface 10a of the substrate 10. Wherein, the second connection end 50 can be formed with the same material or the same layer of metal lines on the substrate 10 to reduce the production process and reduce the production cost.

It should be noted that the first connection end 40, the signal line 80, and the connecting terminal 60 may be formed before the metal line and the light emitting layer 20 are formed and after the substrate 10 is formed or prepared. It is also possible to form the first connection end 40, the signal line 80, and the connecting terminal 60 by flipping the OLED display and forming the first connection end 40 on the rear side of the substrate 10 after the OLED display is packaged.

It should be noted that, in FIG. 3 and FIG. 4, only the case where the extension substrate 13 and the second connection end 50 are provided on all four sides of the substrate 10 is illustrated. By providing the extension substrate 13 and the second connection end 50 at the edge positions on the four sides of the substrate 10, display signals can be transmitted in the vicinity, and the attenuation, delay, and unevenness of the transmission signal can be reduced.

In a specific implementation, the extension substrate 13 and the second connection end 50 may be disposed only on either side, two sides or three sides of the substrate 10.

Further, when the extension substrate 13 and the second connection end 50 are disposed on adjacent sides of the substrate 10, the edge position of the substrate 10 is shaped or edging.

Figure 5:
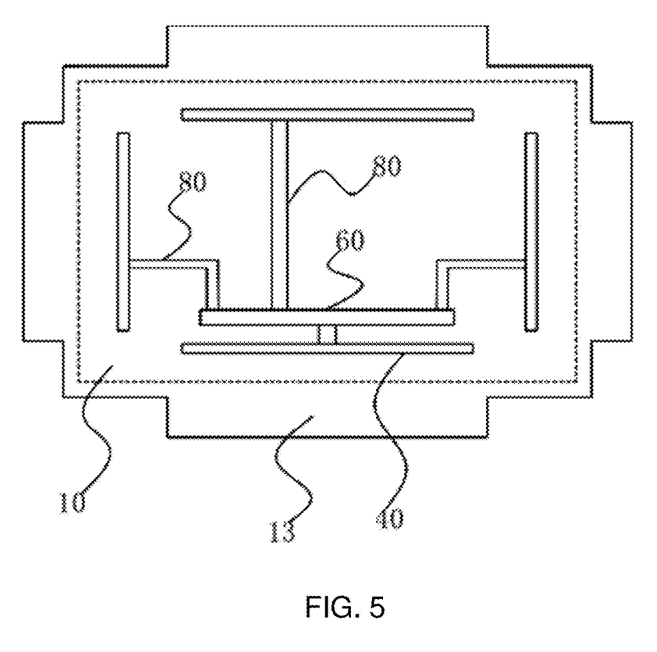

As shown in FIG. 4 and FIG. 5, a connecting terminal 60 may be disposed on the rear surface 10a of the substrate 10, and at least two connecting terminals 60 may also be disposed. The first connection end 40 can be electrically connected to the connecting terminal 60, and all the first connection ends 40 can be electrically connected to one of the connecting terminals 60.

It should be noted that, in FIG. 4, only shown that the connecting terminal 60 is disposed on the rear surface 10a of the substrate 10 at a position near the corresponding first connection end 40. It can be understood that, in a specific implementation, the connecting terminal 60 may also be disposed at the middle portion of the substrate 10.

Figure 6:
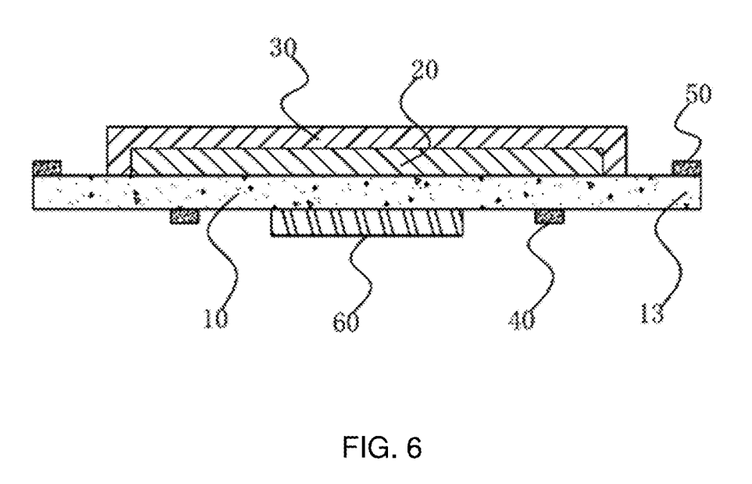
FIG. 6 is a schematic structural view of an OLED display when the extension substrate is not bent according to the first embodiment of the present invention.

Further, as shown in FIG. 6, the second connection end 50 is disposed on one side of the substrate opposite to the first connection end 40 before the extension substrate 13 is bent. Moreover, the first connection end 40 is disposed at an edge position of the extension substrate 13 so that the first connection end 40 is electrically connected to the second connection end 50 after the extension substrate 13 is bent to form a bent portion.

Second Embodiment

Figure 7:
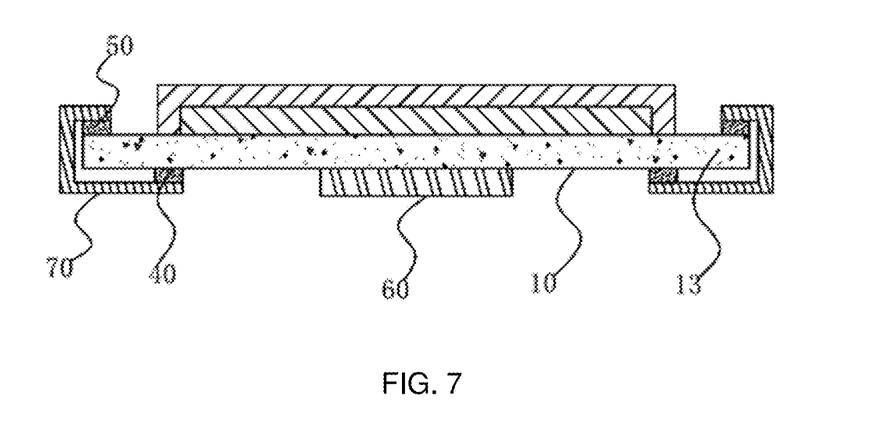
FIG. 7 is a schematic structural view of an OLED display according to a second embodiment of the present invention.

An OLED display, as shown in FIG. 7, which is different from the first embodiment only in that the structure of the extension substrate 13 is different.

Specifically, the extension substrate 13 is parallel to the substrate 10, the second connection end 50 is disposed on a front surface of the extension substrate 13, and at least a portion of the first connection end 40 is disposed at an edge position of the substrate 10.

Third Embodiment

An OLED display, which is different from the first embodiment only in that the extension substrate 13 is further provided with a driving circuit and a connection line.

The driving circuit may be an electro static discharge (ESD) circuit, a gate driving circuit, or the like. The driving circuit is electrically connected to the connecting terminal 60 through a connection line, which is beneficial to a narrow border of the OLED display.

Fourth Embodiment

An OLED display, which is different from the third embodiment only in that the driving circuit and the connection line are disposed at different positions.

Specifically, at least a portion of the driving circuit and the connection line are disposed on the rear surface 10a of the substrate 10.

Fifth Embodiment

Figure 8:
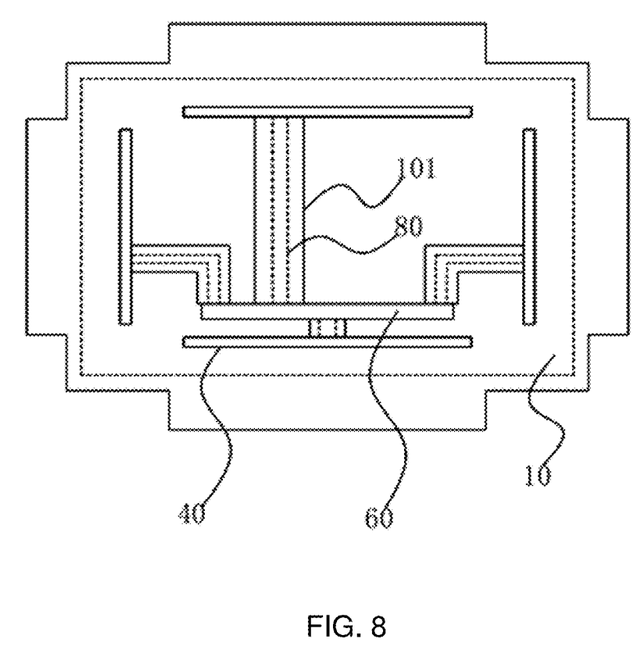
FIG. 8 is a schematic view showing a rear surface of a substrate when an extension substrate is not bent according to a fifth embodiment of the present invention.

An OLED display, as shown in FIG. 8, is different from the third embodiment only in that a protective layer 101 covering the signal line 80 is further disposed on the rear surface 10a of the substrate 10.

Specifically, the protective layer 101 covers the signal line 80, and the first connection end 40 and the connecting terminal 60 are exposed to protect the signal line 80.

The protective layer 101 may be an inorganic layer with a single layer, such as an inorganic layer formed of silicon nitride (SiNx) or silicon oxide (SiOx). The protective layer 101 may also be an organic layer with a single layer, such as polyimide (PI), polycarbonate (PC), polyether sulfone (PES) or polyethylene terephthalate (PET). The protective layer 101 may also be a multi-layer stacked structure of an inorganic layer and an organic layer.

Sixth Embodiment

Figure 9:
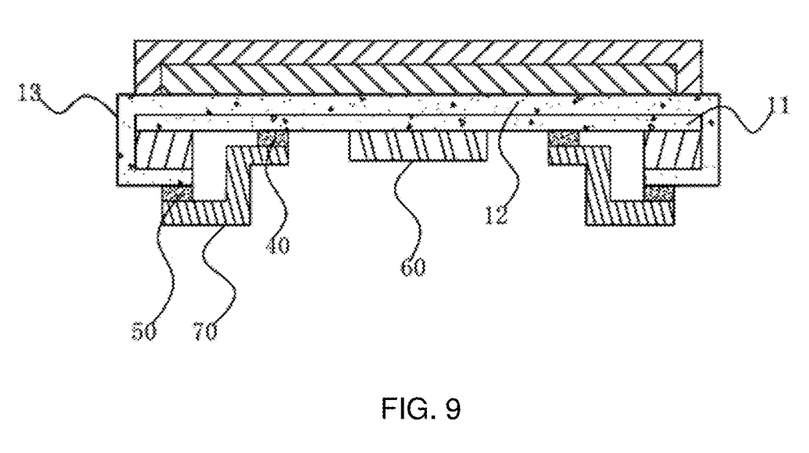
FIG. 9 is a schematic structural view of an OLED display according to a sixth embodiment of the present invention.

An OLED display, as shown in FIG. 9, is different from the first embodiment only in that the structure of the substrate 10 is different.

Specifically, the substrate 10 comprises a first substrate 11 and a second substrate 12 disposed on the first substrate 11. An extension substrate 13 is integrally formed with the second substrate 12.

Wherein the first substrate 11 is made of glass or transparent metal. The second substrate 12 is made of a flexible material such as polyimide (PI), polycarbonate (PC), polyether sulfone (PES), polyethylene terephthalate (PET), polyethylene naphthalate (PEN), polyaryl (PAR) or glass fiber reinforced plastic (FRP).

The beneficial effects of the invention are: By disposing the connecting terminal 60 on the rear surface 10a of the substrate 10, the rear surface 10a of the substrate 10 has a sufficient surface space to arrange low resistance lines. At the same time, a transmission of display signals by the first connection end 40 and the second connection end 50 reducing the attenuation, delay and unevenness of transmission signals, thereby improving a display quality In the above, various other corresponding changes and modifications can be made according to the technical solutions and technical ideas of the present invention to those skilled in the art, and all such changes and modifications are within the scope of the claims of the present invention.

What is claimed is:

1. An organic light emitting diode (OLED) display, the OLED display comprising:
    a substrate;
    a light emitting layer disposed on the substrate;
    an encapsulation layer disposed on the light emitting layer; and
    a border disposed on a periphery of the encapsulation layer;
    wherein at least one connecting terminal and a first connection end are disposed on a rear surface of the substrate, and the connecting terminal is provided with a signal line electrically connected to the first connection end; an edge of the substrate is provided with an extension substrate, the extension substrate is provided with a second connection end, and the first connection end and the second connection end are electrically connected through a flexible circuit board.

2. The OLED display as claimed in claim 1, wherein the first connection end is disposed on the rear surface of the substrate at a position close to the second connection end.

3. The OLED display as claimed in claim 2, wherein the extension substrate is made of a flexible material, the extension substrate is bent toward the rear surface of the substrate to form a bent portion, and the second connection end is disposed on one side of the substrate opposite to the first connection end before the extension substrate is bent.

4. The OLED display as claimed in claim 3, wherein a gap is disposed between the bent portion and the substrate, and the gap is filled with adhesive glue.

5. The OLED display as claimed in claim 2, wherein the extension substrate is parallel to the substrate, the second connection end is disposed on a front surface of the extension substrate, and at least a portion of the first connection end is disposed at an edge position of the substrate.

6. The OLED display as claimed in claim 1, wherein the connecting terminal is disposed at a position on the rear surface of the substrate near the first connection end, or the connecting terminal is disposed at a middle portion of the substrate.

7. The OLED display as claimed in claim 1, wherein a protective layer covering the signal line is disposed on the rear surface of the substrate.

8. The OLED display as claimed in claim 1, wherein the substrate comprises a first substrate and a second substrate disposed on the first substrate, the extension substrate is integrally formed with the second substrate, and the second substrate is made of a flexible material.

* * * * *